(12) United States Patent
Kamii et al.

(10) Patent No.: US 8,339,292 B2
(45) Date of Patent: Dec. 25, 2012

(54) KEY OPERATION DEVICE AND MOBILE TERMINAL DEVICE

(75) Inventors: Toshihiro Kamii, Osaka (JP); Yoshinori Kikui, Osaka (JP)

(73) Assignee: Kyocera Corporation, Kyoto (JP)

( * ) Notice: Subject to any disclaimer, the term of this patent is extended or adjusted under 35 U.S.C. 154(b) by 1270 days.

(21) Appl. No.: 12/059,251

(22) Filed: Mar. 31, 2008

(65) Prior Publication Data

US 2008/0238729 A1     Oct. 2, 2008

(30) Foreign Application Priority Data

Mar. 30, 2007  (JP) ................................ 2007-093023

(51) Int. Cl.
  *H03K 17/94* (2006.01)
  *H03M 11/14* (2006.01)
(52) U.S. Cl. ................. 341/26; 341/22; 341/24; 341/25
(58) Field of Classification Search .................... 341/26, 341/22, 24, 25
  See application file for complete search history.

(56) References Cited

U.S. PATENT DOCUMENTS

| 5,447,383 A * | 9/1995 | Hirono et al. ................. 400/621 |
| 7,617,770 B2 * | 11/2009 | Ohdaira et al. ............... 101/118 |
| 2009/0015556 A1 * | 1/2009 | Kazmi .......................... 345/159 |

FOREIGN PATENT DOCUMENTS

| JP | 62-278624 | 12/1987 |
| JP | 5-189116 | 7/1993 |
| JP | 2004-078688 | 3/2004 |

OTHER PUBLICATIONS

Office Action from Japanese Patent Application No. 2007-093023, mailed on Mar. 1, 2011.

\* cited by examiner

*Primary Examiner* — Rexford Barnie
*Assistant Examiner* — Zeev V Kitov
(74) *Attorney, Agent, or Firm* — Duane Morris LLP; Richard C. Kim (57) ABSTRACT

Disclosed is a key operation device for detecting an open/close state of key switches using row and column signal lines. The key switches include: $1^{st}$ to $4^{th}$ key switches each corresponding to a key for inputting a direction; and ten-key switches correspond one-to-one to keys of a ten-key pad. The $1^{st}$ and $2^{nd}$ key switches are both coupled to one of the row signal lines and each to a different one of two of the column signal lines. The $3^{rd}$ and $4^{th}$ key switches are both coupled to another one of the row signal lines and each coupled to a different one of the two column signal lines to which the $1^{st}$ and $2^{nd}$ key switches are respectively coupled. None of the ten-key switches is coupled to either of the two row signal lines to which the $1^{st}$ and $2^{nd}$ or $3^{rd}$ and $4^{th}$ key switches are coupled.

18 Claims, 11 Drawing Sheets

| | KeySense 0 | KeySense 1 | KeySense 2 | KeySense 3 | KeySense 4 |
|---|---|---|---|---|---|
| KeyScan 0 | ↑ | → | TALK | ✕ | ✕ |
| KeyScan 1 | ↑ | ↓ | BACK | 2 | 3 |
| KeyScan 2 | WEB | 1 | 4 | 5 | 6 |
| KeyScan 3 | L | R | 7 | 8 | 9 |
| KeyScan 4 | OK | SPEAKER | * | 0 | # |

| | KeySense 0 | KeySense 1 | KeySense 2 | KeySense 3 | KeySense 4 |
|---|---|---|---|---|---|
| KeyScan 0 | L | R | 1 | 2 | 3 |
| KeyScan 1 | ↑ | ↑ | * | OK | SPEAKER |
| KeyScan 2 | → | ← | WEB | TALK | BACK |
| KeyScan 3 | # | 0 | 4 | 5 | 6 |
| KeyScan 4 | | | 7 | 8 | 9 |

FIG. 6

|          | KeySense 0 | KeySense 1 | KeySense 2 | KeySense 3 | KeySense 4 |
|----------|------------|------------|------------|------------|------------|
| KeyScan 0 | 1 | L | 2 | R | 3 |
| KeyScan 1 | * | ↑ | WEB | ↓ | # |
| KeyScan 2 | 4 | TALK | 5 | BACK | 6 |
| KeyScan 3 | ✕ | ↓ | 0 | → | ✕ |
| KeyScan 4 | 7 | SPEAKER | 8 | OK | 9 |

FIG. 7

|  | KeySense 0 | KeySense 1 | KeySense 2 | KeySense 3 | KeySense 4 |
|---|---|---|---|---|---|
| KeyScan 0 | ↑ | → | TALK | ✕ | ✕ |
| KeyScan 1 | → | ↓ | BACK | SPEAKER | WEB |
| KeyScan 2 | R | 1 | 4 | 5 | 6 |
| KeyScan 3 | L | 2 | 7 | 8 | 9 |
| KeyScan 4 | OK | 3 | * | 0 | # |

| | KeySense 0 | KeySense 1 | KeySense 2 | KeySense 3 | KeySense 4 |
|---|---|---|---|---|---|
| KeyScan 0 | WEB | BACK | TALK | OK | ✕ |
| KeyScan 1 | ↑ | L | 1 | 2 | 3 |
| KeyScan 2 | ↓ | ✕ | 4 | 5 | 6 |
| KeyScan 3 | ← | R | 7 | 8 | 9 |
| KeyScan 4 | → | SPEAKER | * | 0 | # |

KEY OPERATION DEVICE AND MOBILE TERMINAL DEVICE

BACKGROUND OF THE INVENTION (1) Field of the Invention

The present invention relates to a key operation device for detecting the open/close state of each of a plurality of key switches through row and column signal lines coupled to form a matrix. The present invention also relates to a mobile terminal device having the key operation device.

(2) Description of the Related Art

Conventionally, compact mobile terminal devices, such as mobile phones, employ a key operation unit having a key matrix configuration composed of key scan lines and key sense lines.

Figure 8:
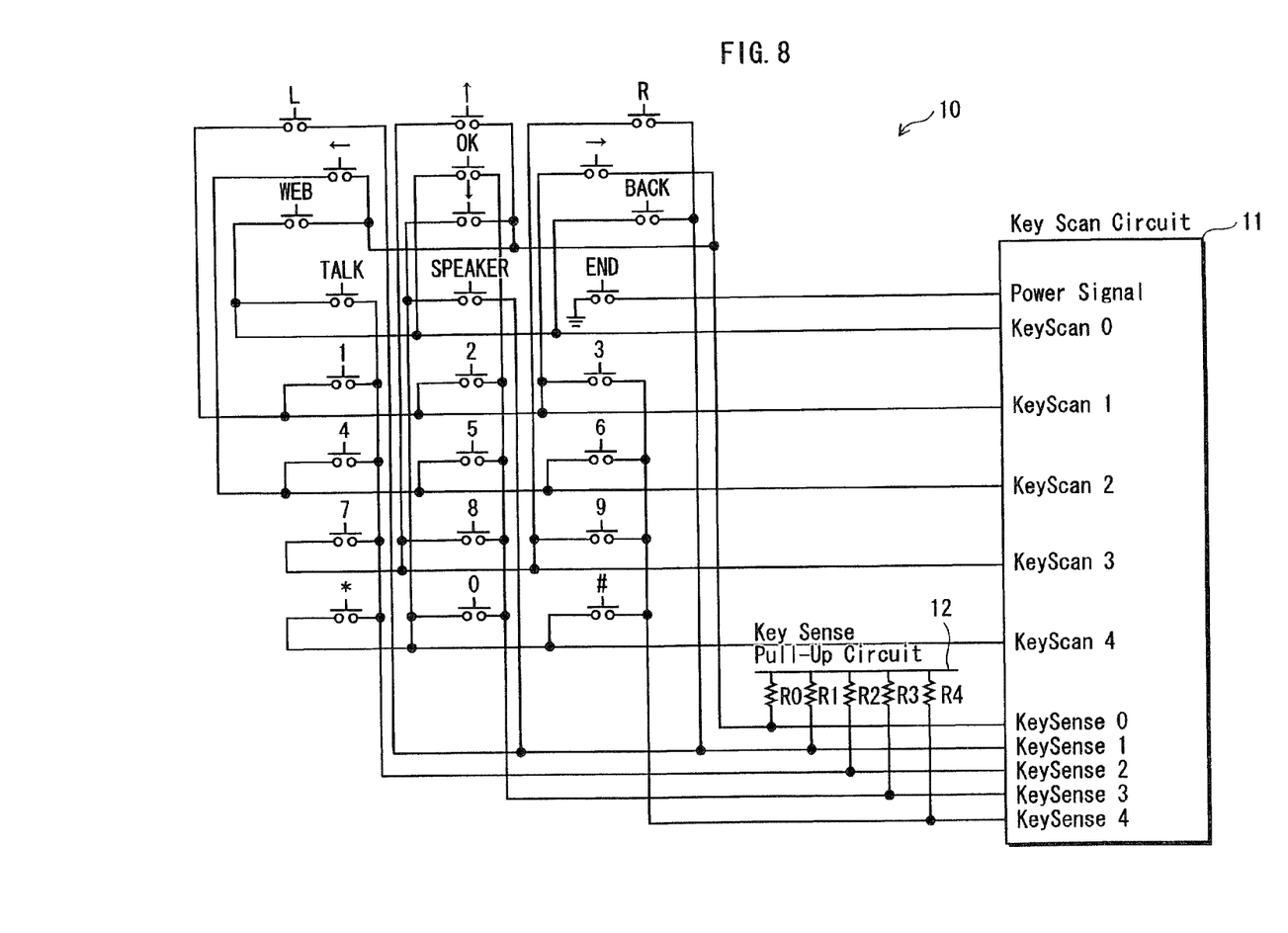
FIG. 8 is a block diagram showing the configuration of a conventional key operation unit.

The following describes a typical key matrix configuration, with reference to FIG. 8.

FIG. 8 shows the configuration of a key operation unit employed in a mobile phone.

As shown in FIG. 8, a conventional key matrix 10 is composed of five key scan lines (KeyScan 0-4) and five key sense lines (KeySense 0-4). A plurality of switches that correspond one-to-one with a plurality of keys of the mobile phone (not shown) are coupled to the key scan lines.

Figure 9:
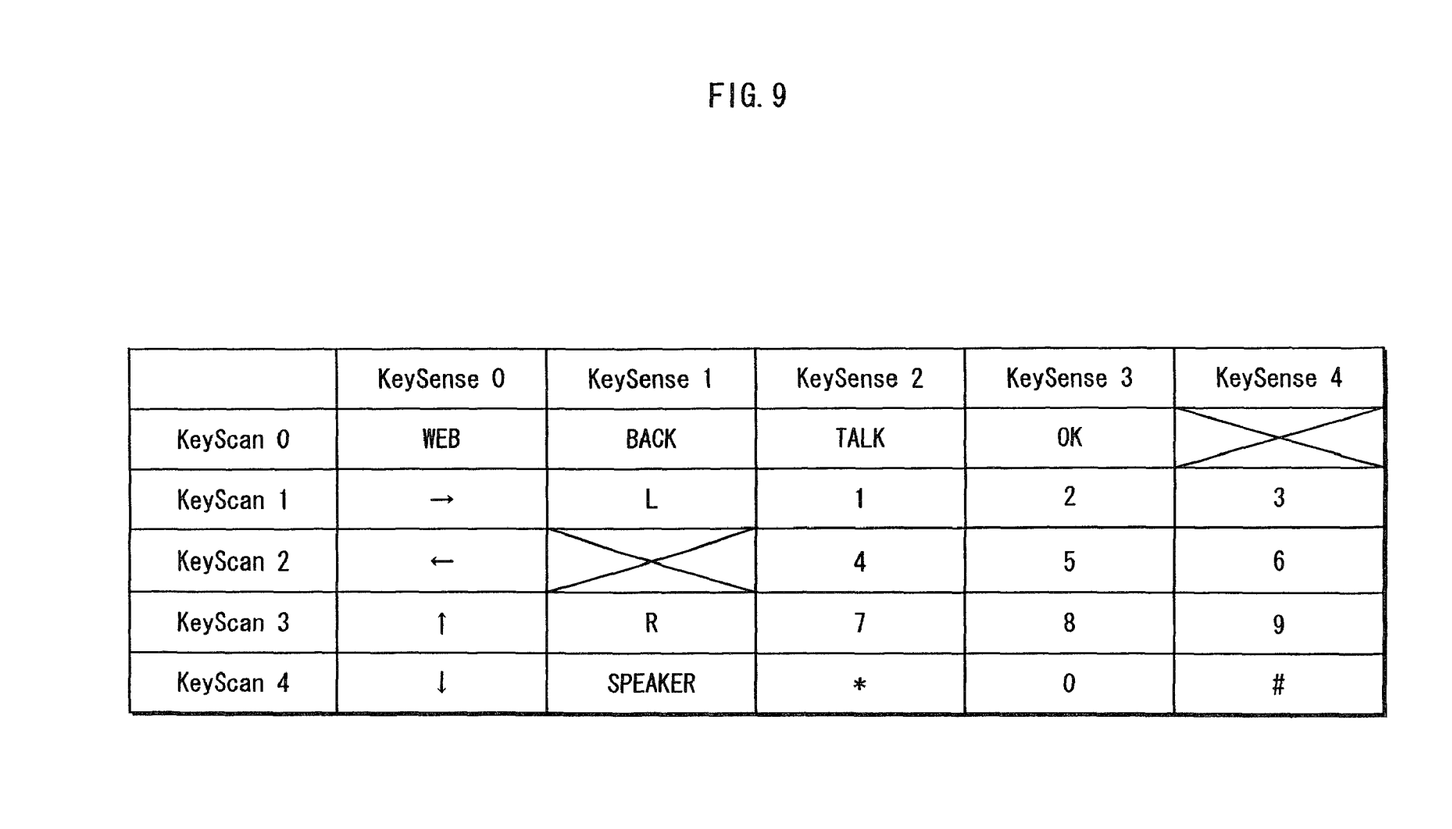
FIG. 9 is a diagram showing a conventional key allocation.

FIG. 9 is a diagram showing the allocation of the keys on the key matrix 10.

The key matrix 10 is coupled to a key scan circuit 11 having a plurality of input/output ports. More specifically, the key scan lines are coupled to the output ports, whereas the key sense lines are coupled to the input ports.

A key sense pull-up circuit 12 having resistors R0-R4 is coupled to the respective key sense lines, so that the output signal of each key sense line is pulled up to a high level at all times when the corresponding switch is open. The key scan circuit 11 sequentially outputs low-level signals to scan the key scanlines and detects the open/close state of each key switch.

Suppose, for example, that a key scan signal is output to KeyScan 0 during the time "TALK" Key is pressed. Under this state, the key switch corresponding to "TALK" Key is closed and thus KeySense 2 is brought into conduction with KeyScan 0. Consequently, the key scan signal output to KeyScan 0 pulls the output signal of KeySense 2 down to a low level. Based on this change in signal level, it is detected that "TALK" Key is pressed.

Recently developed mobile phones are capable of executing game applications thereon. With such a mobile phone, users can play a game by manipulating keys on the key operation unit.

Generally, such a newly-developed mobile phone has a key operation unit that includes a cross-key pad composed of up, down, left, and right keys for input of the respective directions, and also includes numeric keys and symbol keys (i.e., "*" Key and "#" Key). The respective keys are associated with specific functions for playing the game.

During the game, the user may press "↑" and "→" Keys of the cross-key pad at the same time to move a character presented on a display screen in an oblique (up and right) direction. Additionally, the user may press "1" Key of the ten-key pad simultaneously with "↑" and "→" Keys. As above, it often happens during the game that a complex combination of two or more keys of are simultaneously pressed, although such simultaneous key pressing is not normally expected during the time the mobile phone is used to execute phone functions.

Unfortunately, however, the key operation unit having the above-described conventional key matrix configuration may not be able to properly respond to simultaneous pressing of two keys of the cross-key pad when another key of the ten-key pad is also pressed simultaneously.

The malfunction noted above is described with reference to FIGS. 9 and 10.

Figure 10:
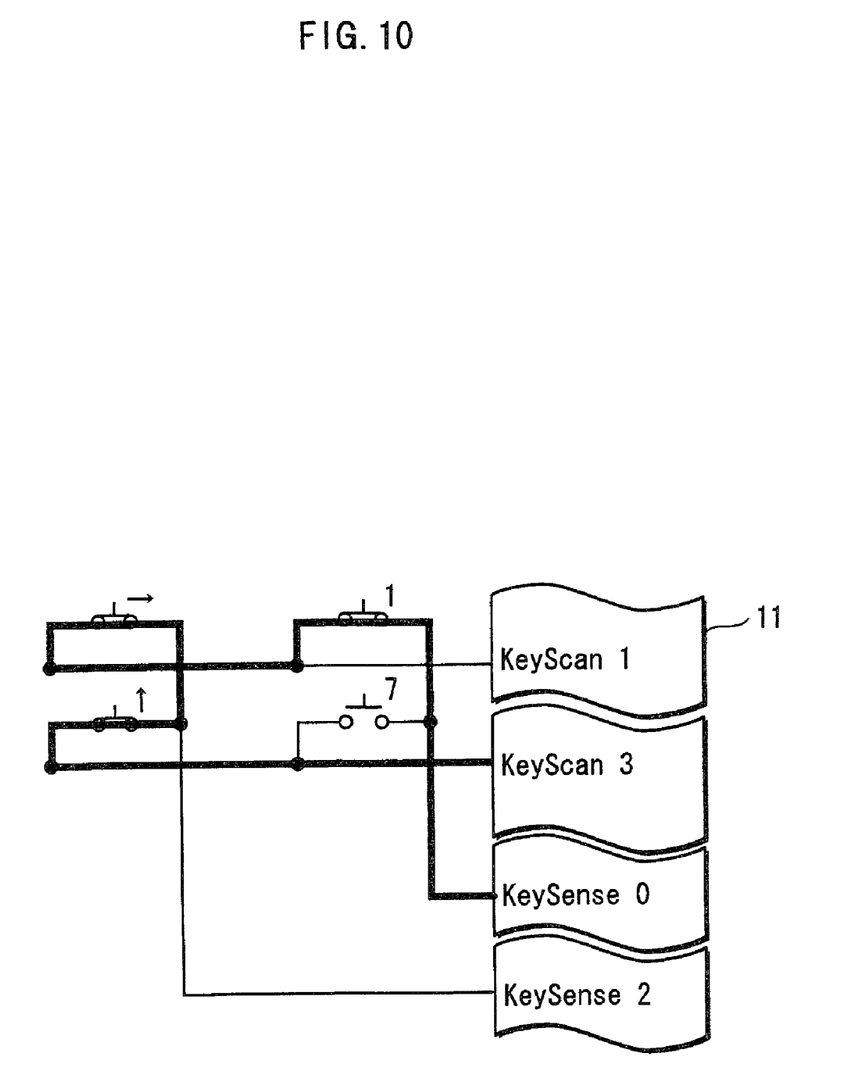
FIG. 10 is a diagram showing the path of current flowing through a conventional key matrix.

In the figures, the up, down, left, and right keys are denoted simply as "↑", "↓", "←", "→" and respectively. Thus, also in the description, the up, down, left, and right keys may be denoted as "↑", "↓", "←", and "→" Keys, respectively.

For purposes of description, it is supposed that "↑" and "→" Keys as well as "1" Key are simultaneously pressed. When the key scan circuit 11 scans KeyScan 1 under this state, both KeySense 0 and KeySense 2 are brought into conduction with KeyScan 1. As a result, it is detected that "→" and "1" Keys are pressed.

When the key scan circuit 11 subsequently scans KeyScan 3, KeySense 2 is brought into conduction with KeyScan 3. As a result, it is detected that "↑" Key is pressed. It should be noted, however, that KeySense 0 is also brought into conduction with KeyScan 3 as shown in FIG. 9 because the key switches corresponding to "↑", "→" and "1" Keys are closed.

As a result of this unintentional conduction, the key scan circuit 11 erroneously detects that "7" Key is also pressed although the key is not pressed. With such malfunctions, it is no longer ensured that the user can correctly play games using the cross-key pad and ten-key pad.

Each key of the ten-key pad other than "7" Key also involves a similar risk as long as the key is coupled to one of the two key scan lines and to one of the two key sense lines that are used to detect pressing of the up, down, left, and right keys. The up, down, left, and right keys are likely to be pressed at the same time.

For example, when "↑" and "→" Keys are simultaneously pressed, an additional key press of any of "1", "2", "3", "7", "8", and "9" Keys may cause an erroneous detection. On the other hand, when "↑" and "←" Keys are simultaneously pressed, an additional key press of any of "4", "5", "6", "7", "8", and "9" may cause an erroneous detection. When "↓" and "→" Keys are simultaneously pressed, an additional key press of any of "1", "2", "3", "*", "0", and "#" may cause an erroneous detection. When "↓" and "←" Keys are simultaneously pressed, an additional key press of any of "4", "5", "5", "6", "*", "0", and "#" may cause an erroneous detection.

Figure 7:
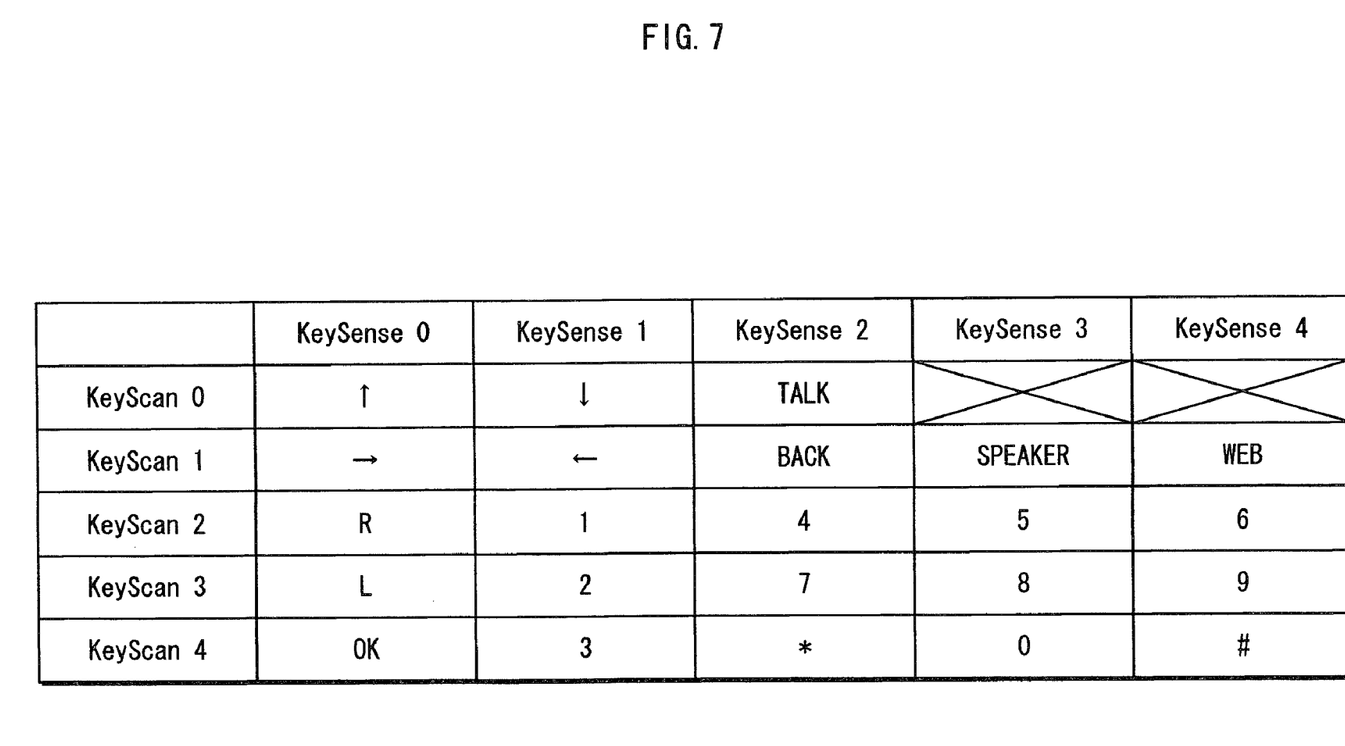
FIG. 7 is a diagram showing a yet another modification of the key operation unit 103.

As described above, the conventional key matrix as shown in FIG. 7 fails to correctly handle the key operation of simultaneous pressing of two directional keys to make an oblique-direction movement, if any key of the ten-key pad is additionally pressed simultaneously with the two directional keys.

Figure 11:
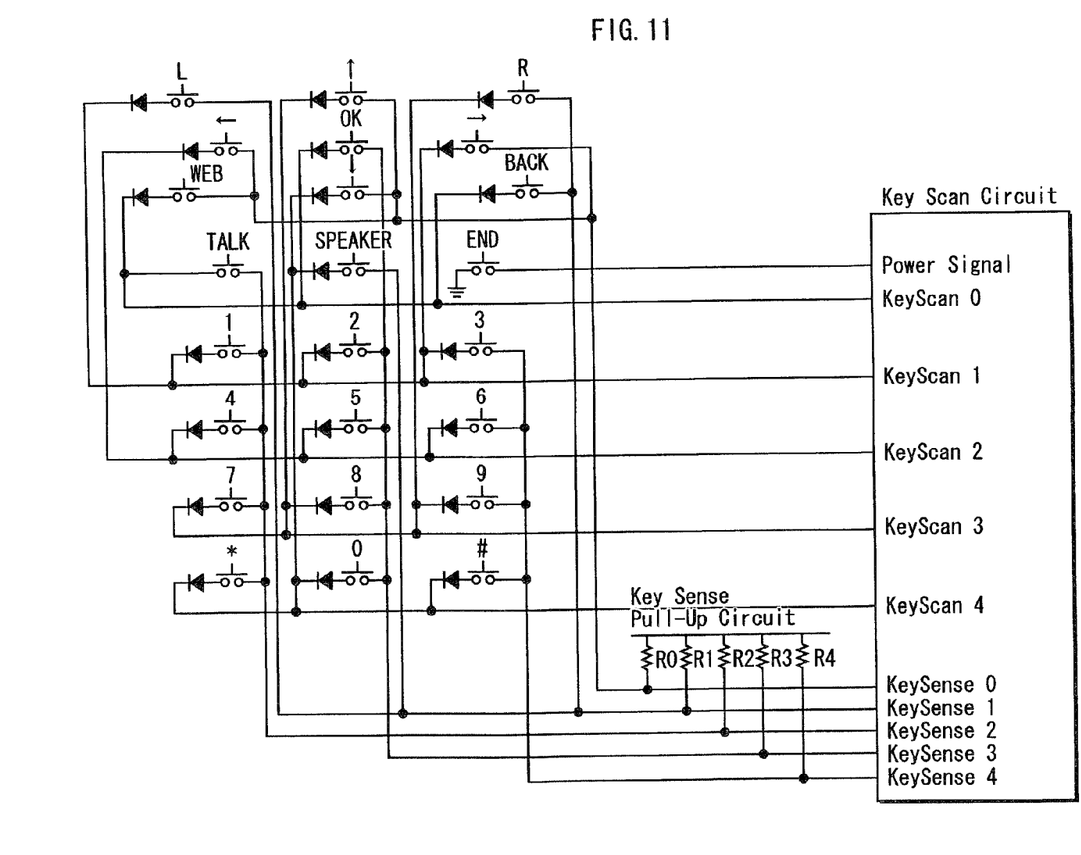
FIG. 11 is a block diagram showing the configuration of a convention key operation unit provided with rectifier circuits.

The above problem is solved by coupling a rectifier circuit (diode) to each key switch as shown FIG. 11 to prevent reverse-current. Yet, this solution is not preferable in view of additional cost required to provide a plurality of diodes. This solution is not preferable also in view of increase in the size of the key matrix due to space required to accommodate the diodes. This contradicts the desire to reduce the overall size of the mobile phone.

SUMMARY OF THE INVENTION

The present invention provides a key operation device for detecting an open/close state of each of a plurality of key switches through a plurality of row and column signal lines that are coupled to form a matrix. The key switches include: a $1^{st}$ key switch corresponding to a key for inputting a $1^{st}$ direction; a $2^{nd}$ key switch corresponding to a key for inputting a $2^{nd}$ direction opposite to the $1^{st}$ direction; a $3^{rd}$ key switch corresponding to a key for inputting a $3^{rd}$ direction different from the $1^{st}$ and $2^{nd}$ directions; a $4^{th}$ key switch corresponding to a key for inputting a $4^{th}$ direction opposite to the $3^{rd}$ direction; and a plurality of ten-key switches corresponding one-to-one to a plurality of keys of a ten-key pad. The $1^{st}$ and $2^{nd}$ key switches are (i) both coupled to a same one of the row signal lines and (ii) each coupled to a different one of the column signal lines. The $3^{rd}$ and $4^{th}$ key switches are (i) both coupled to a same one of the row signal lines other than the one to which the $1^{st}$ and $2^{nd}$ key switches are coupled, and (ii) each coupled to a different one of the two column signal lines to which the $1^{st}$ and $2^{nd}$ key switches are respectively coupled. None of the ten-key switches is coupled to either of the two row signal lines to which the $1^{st}$ and $2^{nd}$ or $3^{rd}$ and $4^{th}$ key switches are coupled. Alternatively, any of the ten-key switches coupled to either of the two row signal lines does not share a same column signal line with any other key of the ten-key pad coupled to the other of the two row signal lines.

The term "matrix" used herein refers to a rectangular-shaped arrangement of: a plurality of signal lines all extending side by side in a first direction; and a plurality of signal lines all extending side by side in a second direction intersecting the first direction. The signal lines extending in one of the first and second directions (i.e., horizontal direction) are referred to as the row signal lines. The signal lines extending in the other direction (i.e., vertical direction) are referred to as the column signal lines.

Generally, either of the row and column signal lines comprise the key scan lines, and the other of the row and column signal lines comprise the key sense lines.

Further, each of the $1^{st}$ to $4^{th}$ key switches are provided for receiving a directional input and corresponds, for example, to a respective one of the up, down, left, and right keys of the cross-key pad. With respect to the keys corresponding to the $1^{st}$ to $4^{th}$ key switches, the following four combinations of the keys can be simultaneously pressed: (i) the keys corresponding to the $1^{st}$ and $3^{rd}$ key switches can be simultaneously pressed; (ii) the keys corresponding to the $1^{st}$ and $4^{th}$ key switches can be simultaneously pressed; (iii) the keys corresponding to the $2^{nd}$ and $3^{rd}$ key switches can be simultaneously pressed; and (iv) the keys corresponding to the $2^{nd}$ and $4^{th}$ key switches can be simultaneously pressed.

Still further, the ten-key pad refers to a set of numeric keys 0-9 or a set of keys including numeric keys 0-9 as well as symbol keys, such as "*" and "#" Keys, that are arranged in a same block with the numeric keys.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENT

The following describes an embodiment of the present invention, with reference to the accompanying drawings.

First of all, a mobile phone 100 embodying the present invention is described.

1. Configuration 1-1. Mobile Phone 100

Figure 1:
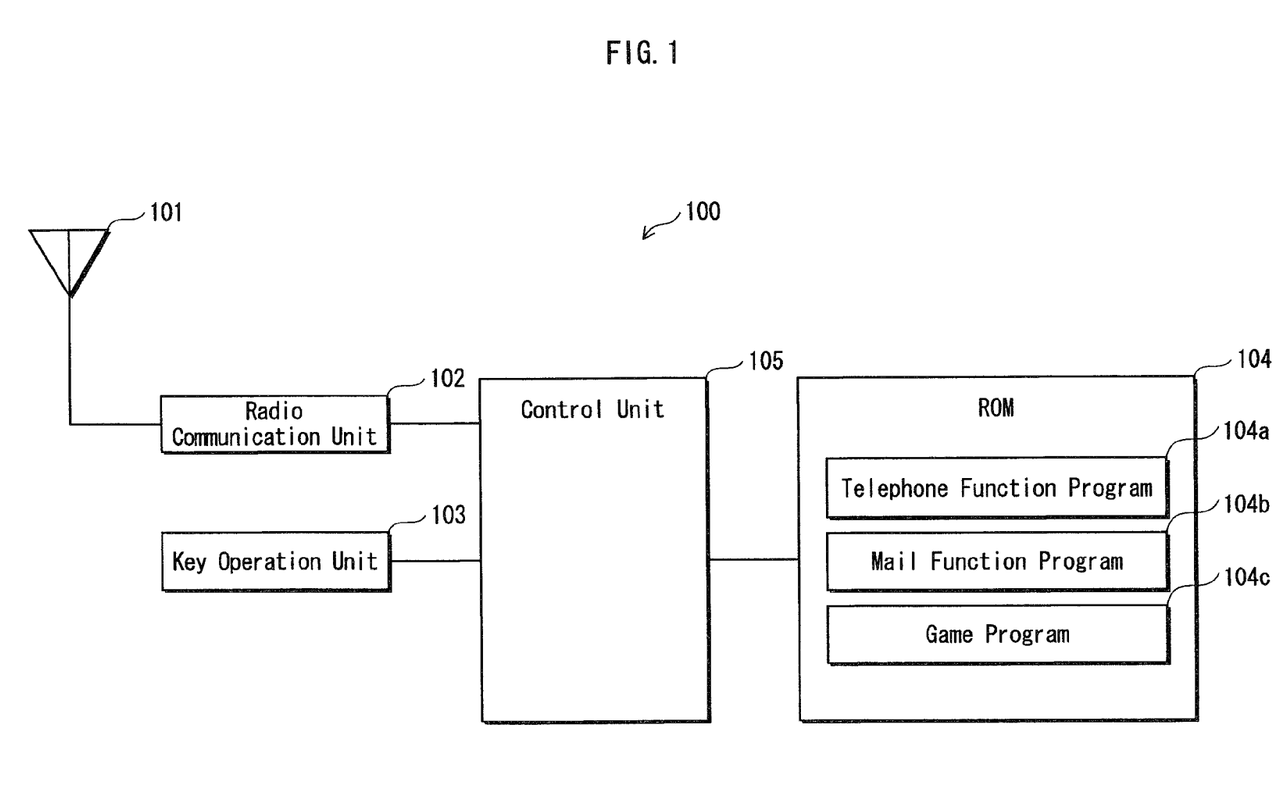
FIG. 1 is a block diagram showing the configuration of a mobile phone 100 according to an embodiment of the present invention.

FIG. 1 is a block diagram showing the configuration of the mobile phone 100.

The mobile phone 100 includes an antenna 101, a radio communication unit 102 coupled to the antenna 101, a key operation unit 103, a ROM (Read Only Memory) 104, and a control unit 105.

The radio communication unit 102 conducts processing related to radio communications. Examples of such processing include demodulation of signals received via the antenna 101 and modulation of signals to be transmitted via the antenna 101.

The key operation unit 103 has plurality of keys and receives user input. The keys include keys of a cross-key pad each for making a directional input and also include keys of a ten-key pad. The key operation unit 103 will be described later in detail.

The ROM 104 is memory storing programs for executing various functions of the mobile phone 100. The major programs stored on the ROM 104 include a telephone function program 104a for placing and receiving calls, a mail function program 104b for executing e-mail transmission and reception, and a game program 104c for executing a predetermined game.

The control unit 105 is a CPU (Central Processing Unit) and executes the respective programs stored on the ROM 104 to implement the respective functions of the mobile phone 100.

For example, at the time of placing or receiving a call, the control unit 105 executes the telephone function program 104a. Through the program execution, the control unit 105 receives a user input specifying a telephone number via the key operation unit 103 and subsequently outputs signals to the radio communication unit 102. The output signals include signals for dialing the received telephone number and voice signals.

At the time of e-mail transmission and reception, the control unit 105 executes the mail function program 104b. Through the program execution, the control unit 105 receives a user input specifying an e-mail address via the key operation unit 103 and outputs text data to the radio communication unit 102.

At the time of executing the game, the control unit 105 executes the game program 104c. Through the program execution, the control unit 105 receives graphics data for rendering a character appearing in the game and also receives, via the key operation unit 103, a user input made by pressing keys of the cross-key pad or the ten-key pad. In response to such user input, the control unit 105 processes the graphics data so that the character rendered on the display screen moves according to the user input.

Generally, the mobile phone 100 is additionally provided with other units and devices including a display unit for displaying various images and graphics, a microphone for audio input, and a speaker for audio output. However, no description of such units and devices are given since they are not particularly relevant to the embodiment of the present invention. The devices and units may be identical in configuration to those of a conventional mobile phone.

1-2. Key Operation Unit 103

Next, the configuration of the key operation unit 103 will be described in detail.

Figure 2:
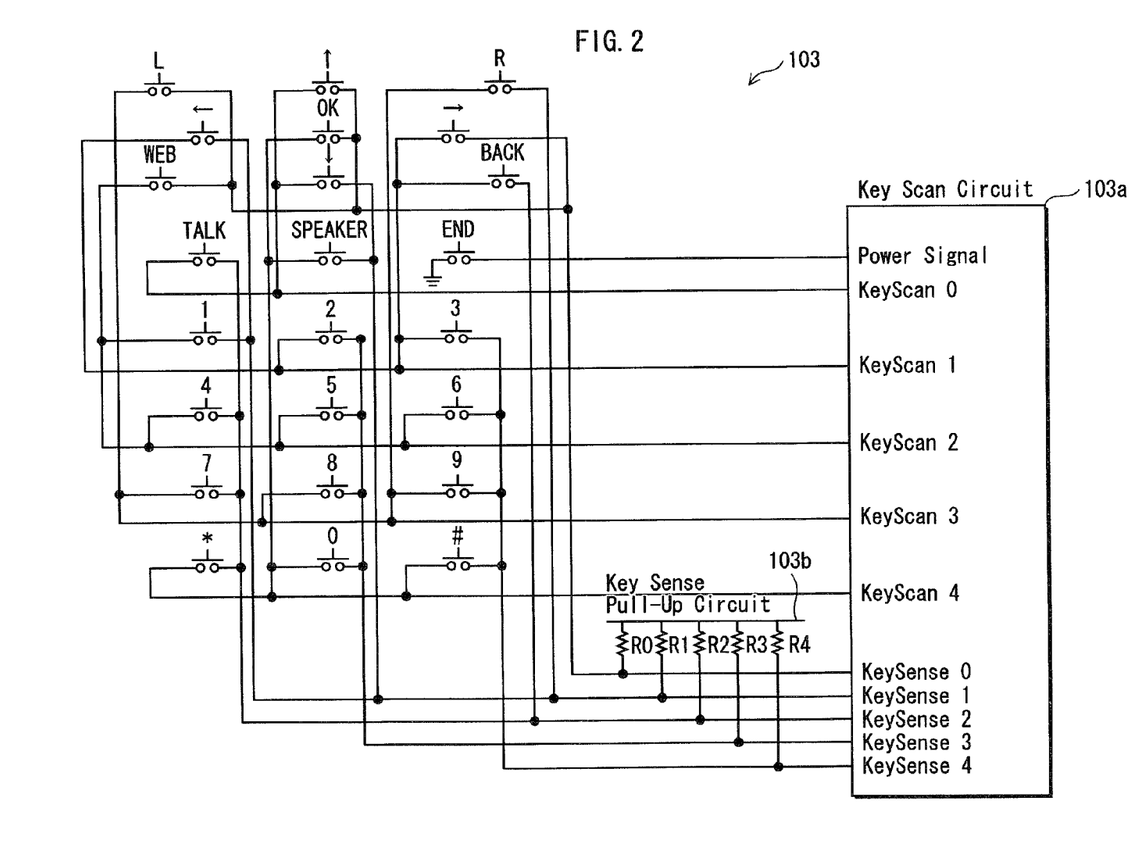
FIG. 2 is a block diagram showing the configuration of a key operation unit 103 of the mobile phone 100.

FIG. 2 is a block diagram showing the configuration of the key operation unit 103.

The key operation unit 103 has a key matrix configuration composed of five key scan lines (KeyScan 0-4) and five key sense lines (KeySense 0-4). The key operation unit 103 includes a plurality of key switches corresponding one-to-one with the plurality of keys. Each key switch is coupled between one of the key scan lines and one of the key sense lines.

Note that the key scan lines of the embodiment are equivalent to row signal lines according to the present invention, whereas the key sense lines of the embodiment are equivalent to the column signal lines according to the present invention.

Figure 3:
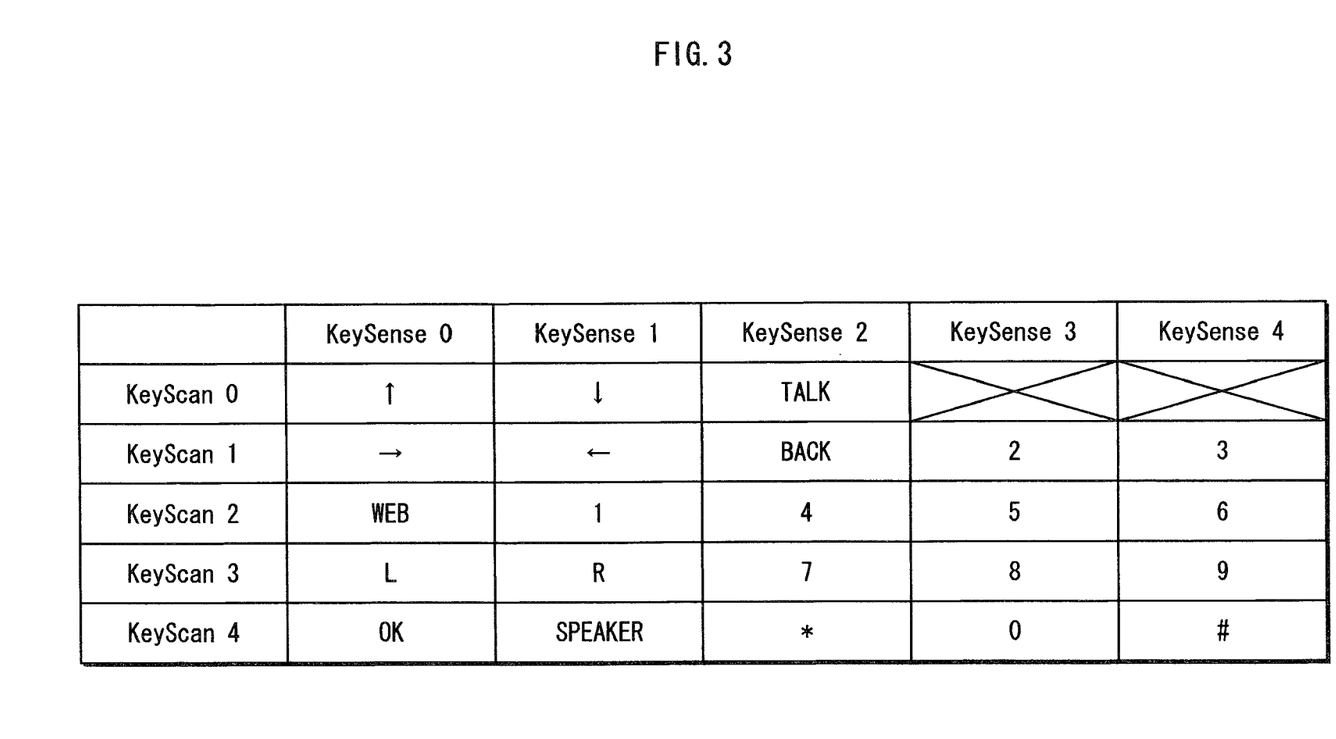
FIG. 3 is a diagram showing the key allocation of the key operation unit 103.

FIG. 3 is a diagram showing the key allocation of the respective keys of the key operation unit 103.

In FIGS. 2 and 3, the up, down, left, and right keys are denoted as "↑", "↓", "←", and "→", respectively. Thus, also in the description, the up, down, left, and right keys may also be denoted as "↑", "↓", "←", and "→" Keys, respectively.

As shown in FIG. 3, on the key matrix of the key operation unit 103, the key switch of "↑" Key is coupled to KeyScan 0 and KeySense 0.

Similarly, the key switch of "↓" Key is coupled to KeyScan 0 and KeySense 1.

The key switch of "TALK" Key is coupled to KeyScan 0 and KeySense 2.

The key switch of "→" Key is coupled to KeyScan 1 and KeySense 0.

The key switch of "←" Key is coupled to KeyScan 1 and KeySense 1.

The key switch of "BACK" Key is coupled to KeyScan 1 and KeySense 2.

The key switch of "2" Key is coupled to KeyScan 1 and KeySense 3.

The key switch of "3" Key is coupled to KeyScan 1 and KeySense 4.

The key switch of "WEB" Key is coupled to KeyScan 2 and KeySense 0.

The key switch of "1" Key is coupled to KeyScan 2 and KeySense 1.

The key switch of "4" Key is coupled to KeyScan 2 and KeySense 2.

The key switch of "5" Key is coupled to KeyScan 2 and KeySense 3.

The key switch of "6" Key is coupled to KeyScan 2 and KeySense 4.

The key switch of "L" Key is coupled to KeyScan 3 and KeySense 0.

The key switch of "R" Key is coupled to KeyScan 3 and KeySense 1.

The key switch of "7" Key is coupled to KeyScan 3 and KeySense 2.

The key switch of "8" Key is coupled to KeyScan 3 and KeySense 3.

The key switch of "9" Key is coupled to KeyScan 3 and KeySense 4.

The key switch of "OK" Key is coupled to KeyScan 4 and KeySense 0.

The key switch of "SPEAKER" Key is coupled to KeyScan 4 and KeySense 1.

The key switch of "*" Key is coupled to KeyScan 4 and KeySense 2.

The key switch of "0" Key is coupled to KeyScan 4 and KeySense 3.

The key switch of "#" Key is coupled to KeyScan 4 and KeySense 4.

Note that the key switches of "↑" and "↓" Keys according to the embodiment are equivalent to one of the two pairs of the $1^{st}$ and $2^{nd}$ key switches or the $3^{rd}$ and $4^{th}$ key switches according to the present invention. Similarly, the key switches of "←" and "→" Keys according to the embodiment are equivalent to the other pair of the $1^{st}$ and $2^{nd}$ key switches or the $3^{rd}$ and $4^{th}$ key switches according to the present invention.

The key operation unit 103 includes a key scan circuit 103a having a plurality of input and output ports. The respective key scan lines are coupled to the output ports, whereas the respective key sense lines are coupled to the input ports.

Note that the up, down, left, and right keys ("↑", "↓", "←", and "→" Keys) are collectively referred to as a cross-key pad and that the numeric keys ("0"-"9" Keys) and symbol keys ("*" and "#" Keys) arranged in a same block with the numeric keys are collectively referred to as a ten-key pad.

As described above, the key switches of the up, down, right, and left keys together constituting the cross-key pad are arranged as follows on the key matrix. That is, the key switches of the up and down keys are commonly coupled to one of the key scan lines (KeyScan 0). Similarly, the key switches of the right and left keys are commonly coupled to another one of the key scan lines (KeyScan 1).

In addition, the key switches of the up and right keys are commonly coupled to one of the key sense lines (KeySense 0). Similarly, the key switches of the down and left keys are commonly coupled to another one of the key sense lines (KeySense 1).

Regarding the ten-keypad, the respective key switches corresponding to "4", "5", "6", "7", "8", "9", "0", "*" and "#" Keys are coupled to the key scan lines and key sense lines other than the key scan lines (KeyScan 0 and 1) and key sense lines (KeySense 0 and 1) to which the key switches of the cross-key pad are coupled.

The key switch of "1" Key is avoided from being coupled to any of the key scan lines to which the key switches of the cross-key pad is coupled. Yet, the key switch of "1" Key is coupled to the key sense line (KeySense 1) to which the key switches of "↓" and "←" Keys are both coupled.

On the other hand, the key switch of the "2" Key is avoided from being coupled to any of the key sense lines to which the key switches of the cross-key pad is coupled. Yet, the key switch of the "2" Key is coupled to the key scan line (KeyScan 1) to which the key switches of "→" and "←" Keys are both coupled.

The key switch of "3" Key is avoided from being coupled to any of the key sense lines to which the key switches of the cross-key pad is coupled. Yet, the key switch of "3" Key is coupled to the key scan line (KeyScan 1) to which the "↑" and "↓" Keys are both coupled.

In FIG. 3, the "X" marks indicate that no key switch is coupled between KeyScan0 and KeySense3 as well as between KeyScan0 and KeySense 4.

A key sense pull-up circuit 103b includes resistors R0-R4 and is coupled to the key sense lines to pull the output signal of each key sense line up to a high level at all times when the corresponding key is not pressed.

Now, the following describes the mechanism of how the key scan circuit 103a detects pressing of a key.

The key scan circuit 103a sequentially outputs low-level key scan signals to the key scan lines by time-sharing.

During the time any of the keys is pressed, the key switch corresponding to the pressed key is closed. Thus, the key scan line and the key sense line that are coupled via the key switch corresponding to the pressed key are brought into conduction. As a result, the key sense line is pulled down to a low level.

The key scan circuit 103a detects the change in the level of voltage across the key sense line to determine the open/close state of the corresponding key switch.

Suppose, for example, "3" Key is pressed. Under this state, when the key scan circuit 103a scans KeyScan 1, KeySense 4 is the only key sense line whose voltage is made low, while voltage across the other key sense lines (KeySense 0-3) remains high. Based on this change in voltage, the key scan circuit 103a detects that "3" Key is pressed.

2. Verification of Detection of Simultaneous Pressing of Three Keys

The following verifies that the key scan circuit 103a correctly detects which keys of the key operation unit 103 are pressed in the case where the user simultaneously presses two keys of the cross-key pad in addition to one key of the ten-key pad.

Figure 4:
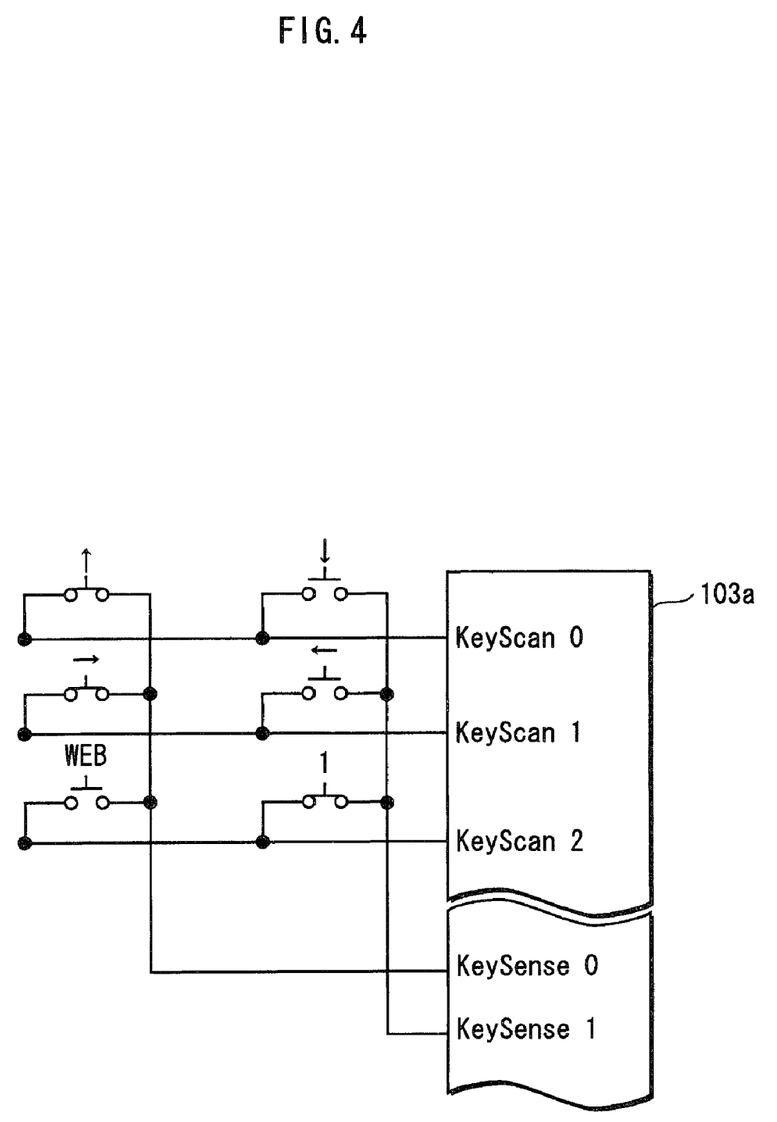
FIG. 4 is a diagram showing the path of current flowing through a key matrix of the key operation unit 103.

FIG. 4 is a diagram showing the path of current flowing through the key matrix when "↑", "→", and "1" Keys are simultaneously pressed.

As shown in FIG. 4, when the key scan circuit 103a scans KeyScan 0, KeySense 0 is brought into conduction with KeyScan 0. As a result, the key scan circuit 103a detects that "↑" Key is pressed.

Next, when KeyScan 1 is scanned, KeySense 0 is brought into conduction with KeyScan 1. As a result, the key scan circuit 103a detects that "→" Key is pressed.

Next, when KeyScan 2 is scanned, KeySense 1 is brought into conduction with KeyScan 2. As a result, the key scan circuit 103a detects that "1" Key is pressed.

The key switches of the simultaneously pressed "1" Key and "↑" and "→" Keys do not share any key scan line. With this configuration, the key scan circuit 103a is free from an error of detecting that any of the ten-key pad other than "1" Key is pressed.

That is, the key scan circuit 103a is enabled to correctly detect the simultaneous pressing of "↑" and "→" Keys in addition to "1" Key, without the risk of mistakenly detecting that a different key is pressed.

The same advantage is achieved even if (i) either of "↑" and "↓" Keys, (ii) either of "→" and "←" Keys, and (iii) one key of the ten-key pad other than "2" and "3" Keys are simultaneously pressed. Since the key switches of those simultaneously pressed keys do not share a key scan line, it is ensured that the key scan circuit 103a is free from an error of detecting that a different key other than the actually pressed keys is pressed.

Regarding "2" Key coupled to KeySense 3, there would be a risk of an erroneous detection if a key switch of any key of the ten-key pad is coupled between KeySense 3 and KeyScan 0 to which the key switches of "↑" and "↓" Keys are coupled. As described above, however, no key switch is coupled between KeySense 3 and Key Scan 0.

Similarly, pressing of "3" Key coupled to KeySense 4 would involve a risk of an erroneous detection if any key of the ten-key pad is coupled between KeySense 4 and Key Scan 0 to which the Key switches of the "↑" and "↓" Keys are coupled. As described above, however, no key switch is coupled between KeySense 4 and KeyScan 0.

As described above, the key switches of "2" and "3" Keys of the ten-key pad are coupled only to either of KeyScan 0 to which the key switches of "↑" and "↓" Keys is coupled and KeyScan 1 to which the key switches of "→" and "←" Keys are coupled. In this case, the key switches of "2" and "3" Keys are coupled to KeyScan 1. With this arrangement, the key scan circuit 103a is enabled to correctly detect the pressed keys, even if two keys of the cross-key pad are simultaneously pressed in addition to "2" or "3" Key.

In short, the key scan circuit 103a of the key operation unit 103 is configured to reliably detect the pressed keys even if two keys of the cross-key pad and one key of the ten-key pad are simultaneous pressed.

As described above, the key matrix of the key operation unit according to the embodiment is so configured that none of the key switches of the ten-keypad (i.e., the key switches of the keys other than those for making directional input) is coupled to a row signal line to which any of the $1^{st}$, $2^{nd}$, $3^{rd}$ and $4^{th}$ key switches is coupled. In other words, the key switches of the ten-key pad do not share a row signal line with the $1^{st}$, $2^{nd}$, $3^{rd}$ and $4^{th}$ key switches. With this configuration, even if one of the keys of the ten-key pad is pressed simultaneously with two of the directional keys, there is no risk that the key scan circuit 103a mistakenly detects that another key adjacent to the key actually pressed is pressed.

Alternatively, if any key switch of the ten-key pad is coupled to one of the two row signal lines to which the $1^{st}$ and $2^{nd}$ key switches or the $3^{rd}$ and $4^{th}$ key switches are coupled, no other key switch is coupled between the other one of the two row signal lines and the column signal line to which the key switch of the ten-key pad is coupled. With this configuration, even if the key of the ten-key pad is pressed simultaneously with the two of the directional keys, there is no risk of an erroneous detection. It is because no other key switch shares the column signal line that would cause an erroneous detection.

This arrangement provides the key operation device having a key matrix configuration capable of correctly processing simultaneous key pressing of two keys of the cross-key pad and one key of the ten-key pad, without employing a rectifier circuit.

3. Modifications

Up to this point, the present invention has been described by way of the key operation unit 103 and the mobile phone 100 embodying the present invention. It should be naturally appreciated, however, that various modifications including the following may be made to the key operation unit 103.

3.1 Modification 1

Figure 5:
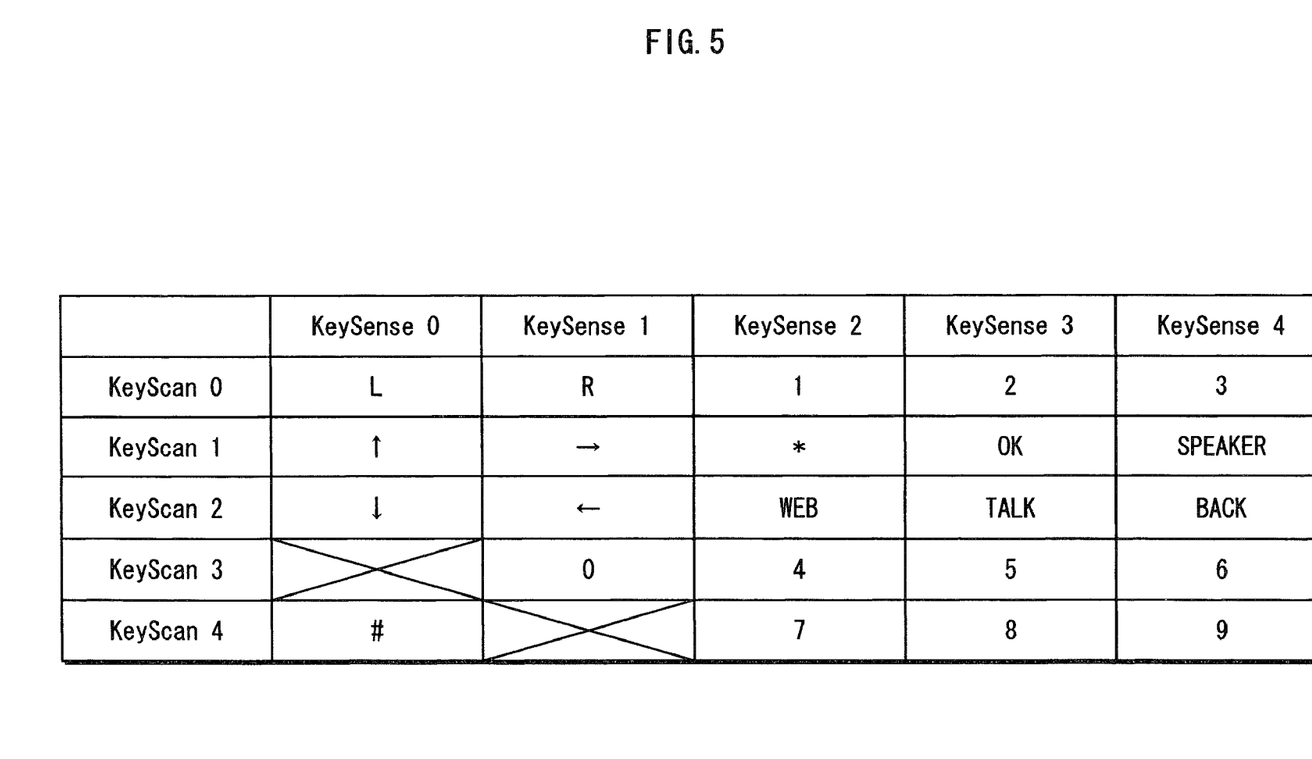
FIG. 5 is a diagram showing a modification of the key operation unit 103.

FIG. 5 is a diagram showing the key allocation of the respective keys of the key operation unit 103 according to a modification 1 of the present invention.

According to the key allocation of the modification 1, the key switches of "↑" and "↓" Keys are commonly coupled to one of the key sense lines (KeySense 0), whereas the key switches of "→" and "←" Keys are commonly coupled to another one of the key sense lines (KeySense 1).

In addition, the key switches of "↑" and "→" Keys are commonly coupled to one of the key scan lines (KeyScan 1), whereas the key switches of "↓" and "←" Keys are commonly coupled to another one of the key scan lines (KeyScan 2).

The key allocation according to the modification 1 also eliminates the risk of an erroneous detection. That is, even if (i) either of "↑" and "↓" Keys, (ii) either of "→" and "←" Keys, and (iii) one key of the ten-key pad other than "0" and "#" Keys are simultaneously pressed, the risk of an erroneous detection by the key scan circuit 103a is eliminated. It is because the key switches of the ten-key pad do not share any key scan line with the key switches of the cross-key pad.

Regarding "0" Key, no key switch of the ten-key pad is coupled between the key scan line (KeyScan 3) to which the key switch of "0" Key is coupled and the key sense line (KeySense 0) to which the key switches of the "↑" and "↓" Keys are both coupled.

Regarding "#" Key, no key switch of the ten-key pad is coupled between the key scan line (KeyScan 4) to which the key switch of "#" Key is coupled and the key sense line (KeySense 1) to which the key switches of the "→" and "←" Keys are both coupled.

With this arrangement, the key scan circuit 103a is enabled to correctly detect the simultaneous key pressing of two keys of the cross-key pad, in addition to either of "0" and "#" Keys.

3.2 Modification 2

Figure 6:
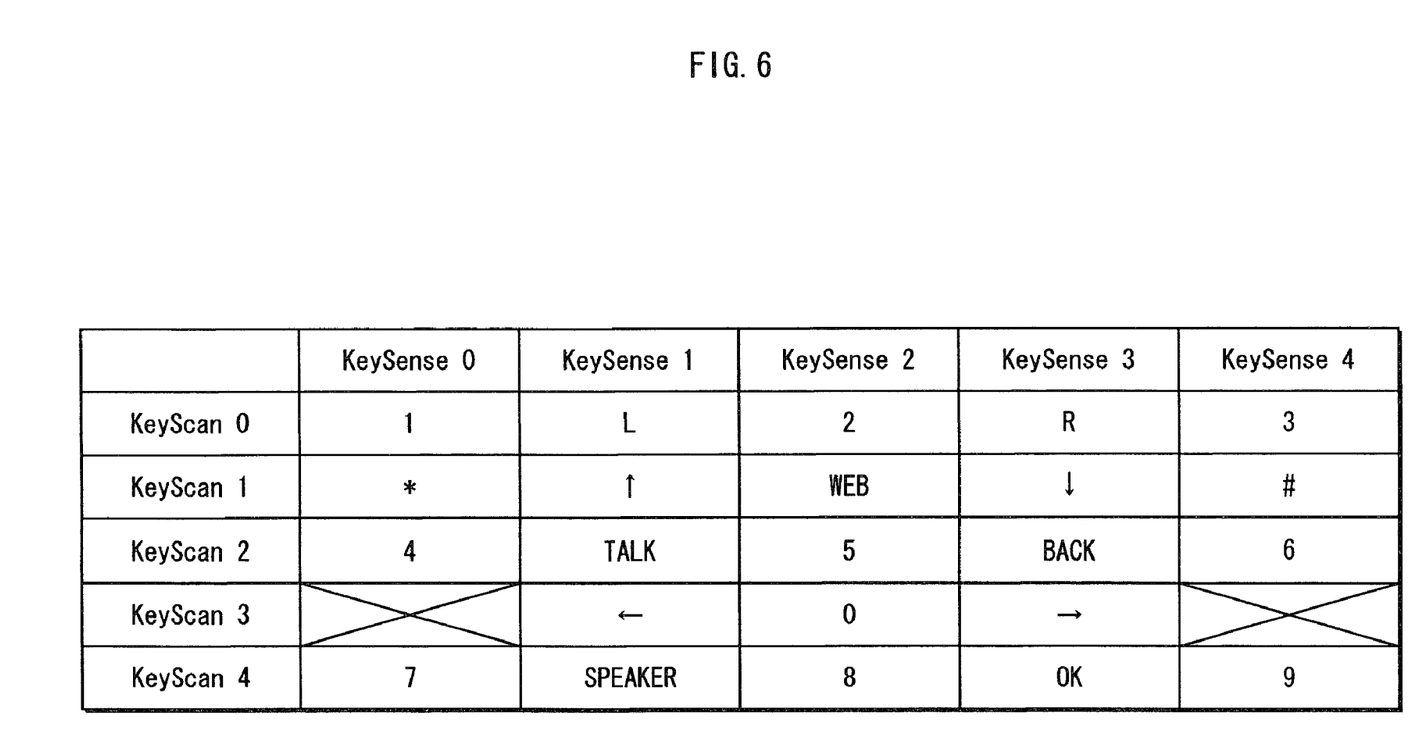
FIG. 6 is a diagram showing another modification of the key operation unit 103.

FIG. 6 is a diagram showing the key allocation of the respective keys of the key operation unit 103 according to a modification 2 of the present invention.

According to the key allocation of the modification 2, the key switches of "↑" and "↓" Keys are commonly coupled to one of the key scan lines (KeyScan 1), whereas the key switches of "→" and "←" Keys are commonly coupled to another one of the key scan lines (KeyScan 3).

In addition, the key switches of "↑" and "←" Keys are commonly coupled to one of the key sense lines (KeySense 1), whereas the key switches of "↓" and "→" Keys are commonly coupled to another one of the key sense lines (KeySense 3).

The key allocation according to the modification 2 also eliminates the risk of an erroneous detection. That is, even if (i) either of "↑" and "↓" Keys, (ii) either of "→" and "←" Keys, and (iii) one key of the ten-key pad other than "0", "*" and "#" Keys are simultaneously pressed, the risk of an erroneous detection by the key scan circuit 103a is eliminated. It is because the key switches of the ten-key pad do not share a key scan line with the key switches of the cross-key pad.

Regarding "0" Key, no key switch of the ten-key pad is coupled between the key sense line (KeySense 2) to which the key switch of "0" Key is coupled and the key scan line (KeyScan 3) to which the key switches of the "↑" and "↓" Keys are both coupled.

Regarding "*" Key, no key switch of the ten-key pad is coupled between the key sense line (KeySense 0) to which the key switch of "*" Key is coupled and the key scan line (KeyScan 3) to which the key switches of the "→" and "←" Keys are both coupled.

Regarding "#" Key, no key switch of the ten-key pad is coupled between the key sense line (KeySense 4) to which the key switch of "#" Key is coupled and the key scan line (KeyScan 3) to which the key switches of the "→" and "←" Keys are both coupled.

With this arrangement, the key scan circuit 103a is enabled to correctly detect simultaneous pressing of two keys of the cross-key pad and either of "0", "*", and "#" Keys.

3.3 Modification 3

FIG. 7 is a diagram showing the key allocation of the respective keys of the key operation unit 103 according to a modification 3 of the present invention.

According to the key allocation of the modification 3, the key switches of "↑" and "↓" Keys are commonly coupled to one of the key scan lines (KeyScan 0), whereas the key switches of "→" and "←" Keys are commonly coupled to another one of the key scan lines (KeyScan 1).

In addition, the key switches of "↑" and "→" Keys are commonly coupled to one of the key sense lines (KeySense 0), whereas the key switches of "↓" and "←" Keys are commonly coupled to another one of the key sense lines (KeySense 1).

More importantly, according to the modification 3, none of the key switches of the ten-key pad (i.e., none of the key switches of "0"-"9" Keys and "*" and "#" Keys) is coupled to the key scan lines (KeyScan0 and KeyScan 1) to which any of "↑", "↓", "←", and "→" Keys are coupled.

With this arrangement, the key scan circuit 103a is enabled to correctly detect simultaneous pressing of two keys of the cross-key pad and either of "0", "*" or "#" Key.

4. Supplemental Note

Up to this point, the present invention has been described by way of the above specific embodiment. It should be naturally appreciated, however, that various modifications including the following may be made to the key operation unit and the mobile terminal device.

(1) According to the above embodiment, the key scan lines are composed of the row signal lines, whereas the key sense lines are composed of the column signal lines. Yet, the present invention is not limited to such.

The row and column signal lines merely refer to a set of signal lines that intersect another set of signal lines in terms of their relative positions. Thus, it is applicable, for example, that the key sense lines are composed of the column signal lines and the key scan lines are composed of the row signal lines.

(2) According to the above embodiment, the $1^{st}$ key switch corresponds to "↑" Key, the $2^{nd}$ key switch corresponds "↓" Key, the $3^{rd}$ key switch corresponds "←" Key, and the $4^{th}$ key switch corresponds "→" Key. It should be naturally appreciated, however, that the present invention is not limited to such.

Any modification is applicable as long as the same positional relation is retained between the inputting directions of the key corresponding to the key switches. More specifically, for example, the $1^{st}$ key switch may be configured to correspond to the "←" Key and the $2^{nd}$ key switch may be configured to correspond to "→" Key. Consequently, the $3^{rd}$ key switch may be configured to correspond to correspond to "↑" Key and the $4^{th}$ key switch may be configured to correspond to "↓" Key.

(3) According to the above embodiment, the up, down, left, and right keys together constituting the cross-key pad are described as separate individual keys. It should be naturally appreciated, however, that the present invention is not limited to such.

For example, the up and down keys may be configured as an integral key that functions as so-called seesaw key. The seesaw key can be pressed only to a single direction at a time. The same holds with respect to the left and right keys.

Some of all of the respective keys of the ten-key pad may also be configured as a seesaw key rather than the separate keys.

(4) According to the above embodiment, the mobile terminal device according to the present invention is embodied as a mobile phone. However, this is merely one example and the present invention is not limited to such.

For example, the key operation device according to the present invention may be embodied on various other devices including a PDA (Personal Digital Assistant) and a laptop PC (Personal Computer).

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A key operation device for detecting an open/close state of each of a plurality of key switches through a plurality of row and column signal lines that are coupled to form a matrix, wherein the key switches include:
   a $1^{st}$ key switch corresponding to a key for inputting a $1^{st}$ direction;
   a $2^{nd}$ key switch corresponding to a key for inputting a $2^{nd}$ direction opposite to the $1^{st}$ direction;
   a $3^{rd}$ key switch corresponding to a key for inputting a $3^{rd}$ direction different from the $1^{st}$ and $2^{nd}$ directions;
   a $4^{th}$ key switch corresponding to a key for inputting a $4^{th}$ direction opposite to the $3^{rd}$ direction; and
   a plurality of ten-key switches corresponding one-to-one to a plurality of keys of a ten-key pad, wherein
   the $1^{st}$ and $2^{nd}$ key switches are (i) both coupled to a same one of the row signal lines and (ii) each coupled to a different one of the column signal lines,
   the $3^{rd}$ and $4^{th}$ key switches are (i) both coupled to a same one of the row signal lines other than the one to which the $1^{st}$ and $2^{nd}$ key switches are coupled, and (ii) each coupled to a different one of the two column signal lines to which the $1^{st}$ and $2^{nd}$ key switches are respectively coupled, and
   the ten-key switches include a plurality of first ten-key switches that are (i) coupled to one or more of the row signal lines, wherein the one or more of the row signal lines do not comprise the two row signal lines to which the $1^{st}$ and $2^{nd}$ or $3^{rd}$ and $4^{th}$ key switches are coupled and (ii) coupled to two or more of the column signal lines, wherein the two or more of the column signal lines comprise at least one of the two column signal lines to which the $1^{st}$, $2^{nd}$, $3^{rd}$, or $4^{th}$ switch are coupled.

2. The key operation device according to claim 1,
   wherein the key switches further include a plurality of process key switches each for causing execution of a predetermined process,
   the first ten-key switches include a third ten-key switch coupled to one of the two column signals to which the 1st, 2nd, 3rd or 4th key switch is coupled, and
   the process key switches include a process key switch that is coupled to an intersection between (i) the row signal line to which the third ten-key switch is coupled and (ii) the other of the two column signal lines.

3. The key operation device according to claim 1,
   wherein if the ten-key switches include a second ten-key switch coupled to one of the two row signal lines to which the $1^{st}$ and $2^{nd}$ or $3^{rd}$ and $4^{th}$ key switches are coupled, none of the other ten-key switches is coupled to an intersection between (i) the column signal line to which the second ten-key switch is coupled and (ii) the other of the two row signal lines.

4. A key operation device for detecting an open/close state of each of a plurality of key switches through a plurality of row and column signal lines that are coupled to form a matrix, wherein the key switches include:
   a $1^{st}$ key switch corresponding to a key for inputting a $1^{st}$ direction;
   a $2^{nd}$ key switch corresponding to a key for inputting a $2^{nd}$ direction opposite to the $1^{st}$ direction;
   a $3^{rd}$ key switch corresponding to a key for inputting a $3^{rd}$ direction different from the $1^{st}$ and $2^{nd}$ directions;
   a $4^{th}$ key switch corresponding to a key for inputting a $4^{th}$ direction opposite to the $3^{rd}$ direction; and
   a plurality of ten-key switches corresponding one-to-one to a plurality of keys of a ten-key pad, wherein
   the $1^{st}$ and $2^{nd}$ key switches are (i) both coupled to a same one of the column signal lines and (ii) each coupled to a different one of the row signal lines,
   the $3^{rd}$ and $4^{th}$ key switches are (i) both coupled to a same one of the column signal lines other than the one to which the $1^{st}$ and $2^{nd}$ key switches are coupled, and (ii) each coupled to a different one of the two row signal lines to which the $1^{st}$ and $2^{nd}$ key switches are respectively coupled, and
   the ten-key switches include a plurality of first ten-key switches that are (i) coupled to one or more of the column signal lines, wherein the one or more of the column signal lines do not comprise the two column signal lines to which the $1^{st}$ and $2^{nd}$ or $3^{rd}$ and $4^{th}$ key switches are coupled and (ii) each coupled to two or more of the row signal lines, wherein the two or more of the row signal lines comprise at least one of the two row signal lines to which the $1^{st}$, $2^{nd}$, $3^{rd}$, or $4^{th}$ switch are coupled.

5. The mobile terminal device according to claim 4, wherein
   the key switches further include a plurality of process key switches each corresponding to a key for causing execution of a predetermined process,
   the first ten-key switches include a third ten-key switch coupled to one of the two row signals to which the $1^{st}$, $2^{nd}$, $3^{rd}$, or $4^{th}$ key switch is coupled, and
   the process key switches include a process key switch that is coupled to an intersection between (i) the column signal line to which the third ten-key switch is coupled and (ii) the other of the two row signal lines.

6. The mobile terminal device according to claim 4, wherein
   if the ten-key switches include a second ten-key switch coupled to one of the two column signal lines to which the $1^{st}$ and $2^{nd}$ or $3^{rd}$ and $4^{th}$ key switches are coupled, none of the other ten-key switches is coupled to an intersection between (i) the row signal line to which the second ten-key switch is coupled and (ii) the other of the two column signal lines.

7. A key operation device for detecting an open/close state of each of a plurality of key switches through a plurality of first-type and second-type signal lines coupled to form a matrix, wherein the key switches include a plurality of directional key switches each corresponding to a key for inputting a direction and a plurality of ten-key switches, wherein the plurality of directional key switches include:
   two directional key switches coupled to a same one of the first-type signal lines; and
   two other directional key switches that are (i) both coupled to a same one of the first-type signal lines other than the one to which the two directional key switches are coupled and (ii) each coupled to a different one of the two second-type signal lines to which the two directional key switches are coupled, and
   the plurality of ten-key switches include a plurality of first ten-key switches that are (i) each coupled to none of the two first-type signal lines to which the plurality of directional key switches are coupled and (ii) coupled to two or more of the second-type signal lines, the second-type signal lines to which the first ten-key switches are coupled including at least one of the two second-type signal lines to which at least one of the plurality of directional key switches is coupled.

8. The key operation device according to claim 7, wherein the two directional key switches further comprise:
- a $1^{st}$ key switch corresponding to a key for inputting a $1^{st}$ direction; and
- a $2^{nd}$ key switch corresponding to a key for inputting a $2^{nd}$ direction opposite to the $1^{st}$ direction, and wherein
- the two other directional key switches include a $3^{rd}$ key switch corresponding to a key for inputting a 3rd direction different from the $1^{st}$ and $2^{nd}$ directions.

9. The key operation device according to claim 8, wherein the plurality of directional key switches further comprise a $4^{th}$ key switch corresponding to a key for inputting a $4^{th}$ direction opposite to the $3^{rd}$ direction, and wherein the $4^{th}$ key switch is coupled to a same one of the first-type signal line to which the $3^{rd}$ key switch is coupled.

10. The key operation device according to claim 8, wherein
- the plurality of key switches further include a plurality of process key switches each corresponding to a key for causing execution of a predetermined process,
- the first ten-key switches include a third ten-key switch coupled to one of the two second-type signals to which the two directional key switches are coupled, and
- the process key switches include a process key switch that is coupled to an intersection between (i) the first-type signal line to which the third ten-key switch is coupled and (ii) the other of the two second-type signal lines to which the third ten-key switch is not coupled.

11. The key operation device according to claim 9, wherein
- the plurality of key switches further include a plurality of process key switches each corresponding to a key for causing execution of a predetermined process,
- the first ten-key switches include a third ten-key switch coupled to one of the two second-type signal lines to which the two directional key switches are coupled, and
- the process key switches include a process key switch that is coupled to (i) the first-type signal line to which the third ten-key switch is coupled and (ii) the other of the two second-type signal lines to which the third ten-key switch is not coupled.

12. The key operation device according to claim 7, wherein if the ten-key switches include a second ten-key switch coupled to one of the two first-type signal lines to which at least one directional key switch is coupled, none of the other ten-key switches is coupled to an intersection between (i) the second-type signal line to which the second ten-key switch is coupled and (ii) the other of the two first-type signal lines.

13. A mobile terminal device comprising the key operation device according to claim 1.

14. The mobile terminal device according to claim 13, further comprising a storage unit operable to store a program for executing a predetermined application, wherein the plurality of directional key switches and the plurality of ten-key switches are each assigned to a specific key for causing an operation for execution of the application.

15. A mobile terminal device comprising the key operation device according to claim 3.

16. The mobile terminal device according to claim 15, further comprising a storage unit operable to store a program for executing a predetermined application, wherein the plurality of directional key switches and the plurality of ten-key switches are each assigned to a specific key for causing an operation for execution of the application.

17. A mobile terminal device comprising the key operation device according to claim 7.

18. The mobile terminal device according to claim 17, further comprising a storage unit operable to store a program for executing a predetermined application, wherein the plurality of directional key switches and the plurality of ten-key switches are each assigned to a specific key for causing an operation for execution of the application.

* * * * *